United States Patent
Sakemi

(10) Patent No.: US 7,009,897 B2
(45) Date of Patent: Mar. 7, 2006

(54) SEMICONDUCTOR MEMORY DEVICE CAPABLE OF APPLYING STRESS VOLTAGE TO BIT LINE PAIR

(75) Inventor: Kazuhiro Sakemi, Hyogo (JP)

(73) Assignees: Renesas Technology Corp., Tokyo (JP); Mitsubishi Electric Engineering Company Limited, Tokyo (JP)

( * ) Notice: Subject to any disclaimer, the term of this patent is extended or adjusted under 35 U.S.C. 154(b) by 392 days.

(21) Appl. No.: 10/191,498

(22) Filed: Jul. 10, 2002

(65) Prior Publication Data

US 2003/0031069 A1   Feb. 13, 2003

(30) Foreign Application Priority Data

Aug. 13, 2001   (JP)   ............................ P2001-245492

(51) Int. Cl.
*G11C 7/00*   (2006.01)
(52) U.S. Cl. ................. 365/201; 365/200; 365/230.06; 365/230.08
(58) Field of Classification Search ................ 365/201, 365/200, 230.06, 230.08
See application file for complete search history.

(56) References Cited

U.S. PATENT DOCUMENTS

| 5,471,429 A | * | 11/1995 | Lee et al. | 365/201 |
| 6,111,801 A | * | 8/2000 | Brady | 365/201 |
| 6,160,745 A | * | 12/2000 | Hashimoto | 365/200 |
| 6,219,285 B1 | * | 4/2001 | Murakuki et al. | 365/200 |
| 6,310,807 B1 | * | 10/2001 | Ooishi et al. | 365/200 |
| 6,341,089 B1 | * | 1/2002 | Sawada et al. | 365/191 |
| 6,603,691 B1 | * | 8/2003 | Yoo et al. | 365/201 |
| 6,667,915 B1 | * | 12/2003 | Yonezu et al. | 365/200 |

FOREIGN PATENT DOCUMENTS

JP   11-120794   4/1999

* cited by examiner

*Primary Examiner*—Connie C. Yoha
(74) *Attorney, Agent, or Firm*—McDermott Will & Emery LLP

(57) ABSTRACT

A write buffer drives in a normal operation a level in potential of an I/O line pair in accordance with data externally input to be written, whereas a burn in write buffer is controlled in a test operation by a control circuit to drive the I/O line pair in level. A column address decoder in the test operation is controlled by the control circuit to select simultaneously a plurality of bit line pairs capable of coupling with a single I/O line pair.

8 Claims, 10 Drawing Sheets

SEMICONDUCTOR MEMORY DEVICE CAPABLE OF APPLYING STRESS VOLTAGE TO BIT LINE PAIR

BACKGROUND OF THE INVENTION

1. Field of the Invention

The present invention relates to a configuration of a semiconductor memory device having a burn in test function.

2. Description of the Background Art

As dynamic random access memory (DRAM) and the like have higher degrees of integration and larger capacitance, it is important to test semiconductor memory devices to ensure their reliability before they are shipped as finished products.

In particular, there exists a chip which has electrical characteristics initially allowing it to be a good product but also has various latent defects for example of a gate insulation film and an interconnection that have been introduced during the process for fabricating the chip. It can be said that such a chip internally has a so-called "initial defect" causing the chip to fail in a relatively short period of time after an operation starts.

To enhance a product in reliability, before the product is shipped it is tested by applying stress to it to manifest such a latent defect and thus screen out the defective chip. DRAM and other similar semiconductor memory devices are thus screened not only by applying temperature stress to a chip in an environment of a high temperature but also applying electrical stress to a circuit internal to the chip to "burn-in-test" it.

Conventionally in such a burn in test if stress voltage is applied in a memory cell array between bit lines, data of a memory cell is amplified by a sense amplifier to apply voltage.

The application of stress to a bit line that depends on data previously written to a memory cell, however, is disadvantageous, as described below:

i) voltage allowed to be applied as stress between bit lines would be that which can be read from a memory cell and also amplified by a sense amplifier. For example if it is desired to apply high voltage to apply large stress to further accelerate stress between bit lines, the high voltage applied would affect a memory cell transistor, a memory cell capacitor and the like and thus get in the way of maintaining the reliability of the memory cell. As such for example it is difficult to apply large stress voltage to accelerate the test in order to maintain the reliability of a memory cell transistor, a memory cell capacitor and the like; and ii) for a particular pattern of data that a tester apparatus can write to a memory to be tested, a particular configuration of I/O to be tested, and the like, stress voltage can hardly be applied to a bit line.

Thus the stress application is insufficient to manifest a defect existing between bit lines and as a result an chips having a latent initial defect can hardly be detected in a test of a short period of time.

Furthermore, an I/O line communicating data with the bit line also cannot receive sufficient stress if the application of stress to the bit line depends on data previously written to a memory cell.

SUMMARY OF THE INVENTION

The present invention contemplates a semiconductor memory device capable of applying steady stress voltage between bit lines.

The present invention generally provides a semiconductor memory device including: a control circuit controlling a normal operation and a test operation of the semiconductor memory device; a memory cell array having a plurality of memory cells arranged in rows and columns; a plurality of bit line pairs provided to correspond to the columns of the memory cell array; a plurality of data line pairs each provided to correspond to a predetermined number of the plurality of bit line pairs; a write circuit operative in the normal operation in response to data provided external to the semiconductor memory device to be written, to drive a level in potential of the data line pair; a test potential drive circuit controlled in the test operation by the control circuit to drive a level in potential of the data line pair; and a column select circuit operative in the normal operation in response to an address signal and controlled in the test operation by the control circuit to select the column of the memory cells and transmitting the level in potential of the data line pair to the bit line pair corresponding to the selected column of the memory cells.

Preferably the semiconductor memory device further includes a plurality of sense amplifiers provided to correspond to the bit line pair to amplify a difference in potential on the bit line pair. The column select circuit includes a decode circuit operative in the normal operation in response to an address signal and controlled in the test operation by the control circuit to selectively activate a plurality of column select signals, and a plurality of transmission circuits provided to correspond to the bit line pair and selectively activated by a corresponding one of the plurality of column select signals to transmit the level in potential of the data line pair to the bit line pair corresponding to the selected column of the memory cells. The control circuit in the test operation activates alternately the plurality of transmission circuits corresponding to an adjacent one of the bit lines.

Alternatively preferably the semiconductor memory device further includes a plurality of sense amplifiers provided to correspond to the bit line pair and controlled by the control circuit to receive at least a first power supply potential selectively to amplify a difference in potential on the bit line pair. The column select circuit includes a decode circuit operative in the normal operation in response to an address signal and controlled in the test operation by the control circuit to selectively activate a plurality of column select signals, and a plurality of transmission circuits provided to correspond to the bit line pair and selectively activated by a corresponding one of the plurality of column select signals to transmit the level in potential of the data line pair to the bit line pair corresponding to the selected column of the memory cells. The control circuit the test operation controls the test potential drive circuit to couple a data line of the data line pair with a second power supply potential higher than the first power supply potential, activates the transmission circuit and supplies the sense amplifier with the first power supply potential.

Thus the present invention has an advantage that whatever data may be stored in a memory cell that has a non-selected state, a bit line pair can receive stress voltage.

The present invention has another advantage that stress voltage can be applied in a sense amplifier between a pair of bit lines, to a transmission circuit, and the like.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
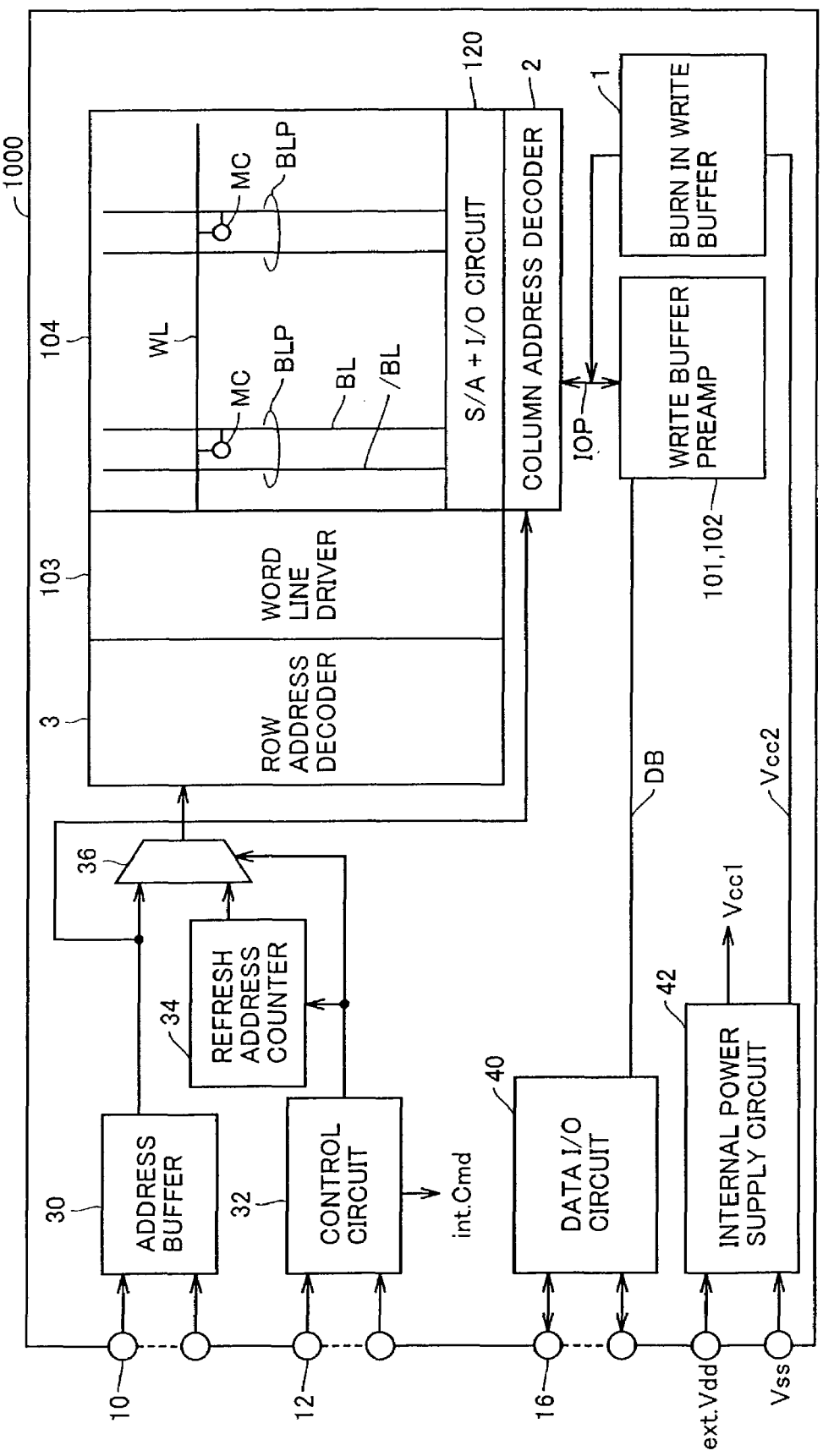
FIG. 1 is a block diagram schematically showing a configuration of a semiconductor memory device 1000 of a first embodiment of the present invention.

FIG. 1 is a block diagram schematically showing a configuration of a semiconductor memory device 1000 of a first embodiment of the present invention.

Hereinafter semiconductor memory device 1000 is assumed to for example be dynamic random access memory (DRAM).

With reference FIG. 1 in DRAM 1000 an address buffer 30 receives row and column address signals through an address signal input terminal group 10. Address buffer 30 is responsive to address signals A0 to An, wherein n is a natural number, and when address buffer 30 receives a row address it generates a row-related, internal row address signal RA[0] to RA[j], /RA[j] to /RA[j], wherein j is a natural number, and when address buffer 30 receives a column address it generates a column-related, internal column address signal CA[0] to CA[k], /CA[0] to /CA[k], wherein k is a natural number. Note that signals X and /X are complementary signals.

A control circuit 32 is responsive to a signal received from address buffer 30 and a command signal received through an external control signal input terminal group 12, such as an external row address strobe signal /RAS, a column address strobe signal /CAS and a write enable signal /WE, to output an internal control signal int. Comd provided to control an operation of each component of the DRAM, as will be described more specifically hereinafter.

Herein, internal control signal int. Comd is generally referred to to indicate a plurality of internal control signals provided to control each component of the DRAM. Furthermore, although not particularly limited, hereinafter of external control signal input terminal group 12 a clock terminal receives an external clock CLK and DRAM 1000 is timed by clock signal CLK to receive external control signals, address signals and the like for the sake of illustration.

DRAM 1000 further includes a memory cell array 104.

Memory cell array 104 includes a plurality of memory cells MCs arranged in rows and columns, a word line WL provided to correspond to each row of memory cell array 104 to select memory cell MC, and a bit line pair BLP provided to correspond to a respective memory cell column of memory cell array 104 to read and write data from and to a selected memory cell MC. Bit line pair BLP has bit lines BL and /BL.

DRAM 1000 also includes a selector 36 receiving a signal from address buffer 30 and an output of a refresh address counter 34 and controlled by control circuit 32 to output one of them, a row address decoder 3 receiving an output of selector 36 and generating a decode signal for selecting word line WL, a word line driver 103 driving a potential of a selected word line in response to a decode signal received from row address decoder 3, a column address decoder 2 receiving an internal column address signal from address buffer 30 to generate a decode signal for selecting a corresponding memory cell column, and a sense amplifier and I/O circuit 120 detecting and amplifying data of memory cell MC connected to a selected row (word line), and selectively reading data from memory cell array 104 in response to a column select signal.

A signal from a selected memory cell MC is read out of memory cell array 104 and transmitted on an I/O line pair IOP and thus received by a preamplifier 102 which in turn transmits the read data to a data input/output circuit 40 on a data bus DB. Data input/output circuit 40 outputs the read data through a data input/output terminal group 16.

Otherwise, through data input/output terminal group 16 data input/output circuit 40 receives a signal which is in turn transmitted on data bus DB to write buffer 101 which in turn further transmits the signal on I/O line pair IOP to bit line pair BLP selected by sense amplifier and I/O circuit 120.

Although not shown in FIG. 1, memory cell array 104 includes a regular memory cell array RMR having a plurality of regular memory cells and a redundant memory cell column SPC and a redundant memory cell row SPR each having a plurality of redundant memory cells, and row and column address decoders 3 and 2 select a redundant memory cell rather than a regular memory cell when a previously stored defective address and an address of a regular memory cell to be selected match.

DRAM 1000 also includes an internal power supply circuit 42 externally receiving an external power supply voltage ext. Vdd and a ground voltage Vss to generate an internal power supply voltage Vcc1 applied for example to column and row address decoders 2 and 3 and sense amplifier and I/O circuit 120 and an internal power supply voltage Vcc2 higher than internal power supply voltage Vcc1, and a burn in write buffer 1 receiving internal power supply voltage Vcc2 and controlled by control circuit 32 to output in a static burn in test a stress potential to be applied to bit line pair BLP through I/O line pair IOP.

Figure 2:
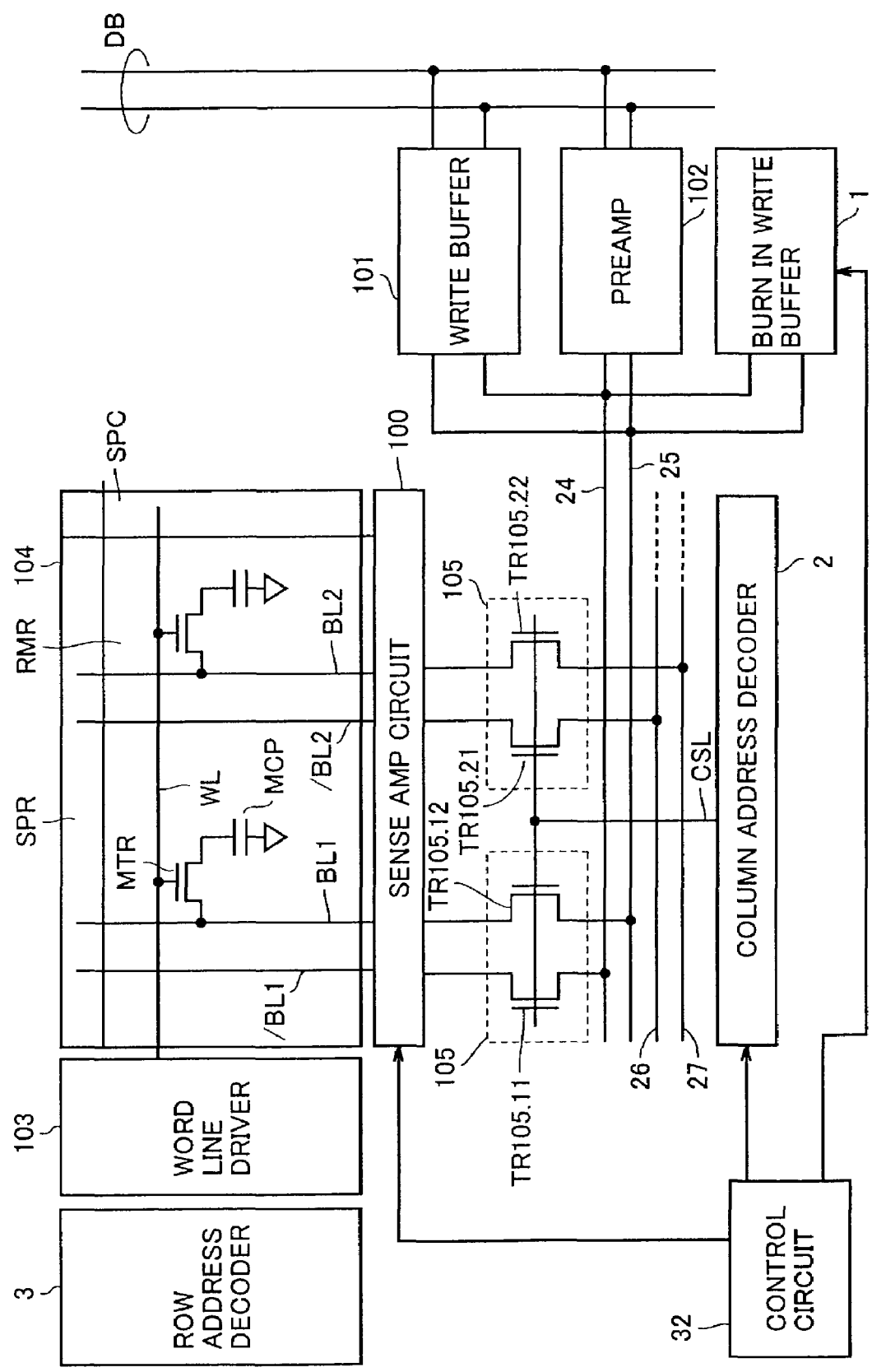
FIG. 2 is a block diagram extracting and schematically showing a memory cell array 104 and a configuration provided to read/write data from/to the array.

FIG. 2 is a block diagram extracting a portion of the configuration of the FIG. 1 DRAM, schematically showing memory cell array 104 and a configuration provided to write/read data to/from memory cell array 104.

Sense amplifier and I/O circuit 120 includes a sense amplifier circuit 100 amplifying read data and an I/O gate 105 transmitting the amplified, read data selectively to I/O line pairs 24, 25 and 26, 27 in response to a column select signal CSL output from column address decoder 2. I/O gate 105 includes n channel MOS transistors TR105.11 and TR105.12 provided between bit line pair BL1,/BL1 and I/O line pair 24, 25, respectively, and having a gate controlled in potential by signal CSL, and n channel MOS transistors TR105.21 and TR105.22 provided between bit line pair BL2, /BL2 and I/O line pair 26, 27, respectively, and having a gate controlled in potential by signal CSL. Hereinafter bit lines BL1 and BL2 will generally be referred to as bit line BL and bit lines /BL1 and /BL2 will generally be referred to as bit line /BL.

Memory cell MC has a memory cell capacitor MCP storing a cumulative amount of electric charge representing data to be held, and a memory cell transistor MTR having a gate potential selected by word line WL, and selectively connecting one node of memory cell capacitor MCP and bit line BL (or /BL) together.

Corresponding to I/O line pair 24 and 25 or 26 and 27, respectively, in a normal mode of operation for a write operation write buffer 101 receives from data bus DB data to be written and transmits the data to the I/O line and for a read operation preamplifier 102 receives read data from the I/O line and transmits the data to data bus DB, and in the static burn in test burn in write buffer 1 is controlled by control circuit 32 to produce data to be provided to bit line pair BLP. Note that FIG. 2 representatively extracts and shows only write buffer 101, preamplifier 102 and burn in write buffer 1 corresponding to I/O line pair 24 and 25 by way of example.

Thus, in the static burn in the test operation, write buffer 101 is inactivated and burn in write buffer 1 instead outputs a level in potential and the I/O line is thus driven thereto.

Furthermore, as will be described hereinafter, while column address decoder 2 in the normal mode of operation also operates in response to a column address signal received via address buffer 30 to activate a corresponding column select signal CSL, in the static burn in test it activates column select signal CSL of a plurality of column select signals that is designated by control circuit 32.

Thus a bit line pair corresponding to a memory cell column in regular memory cell array RMR and a bit line pair provided to correspond to a redundant memory cell column both receive stress voltage produced by burn in write buffer 1.

Figure 3:
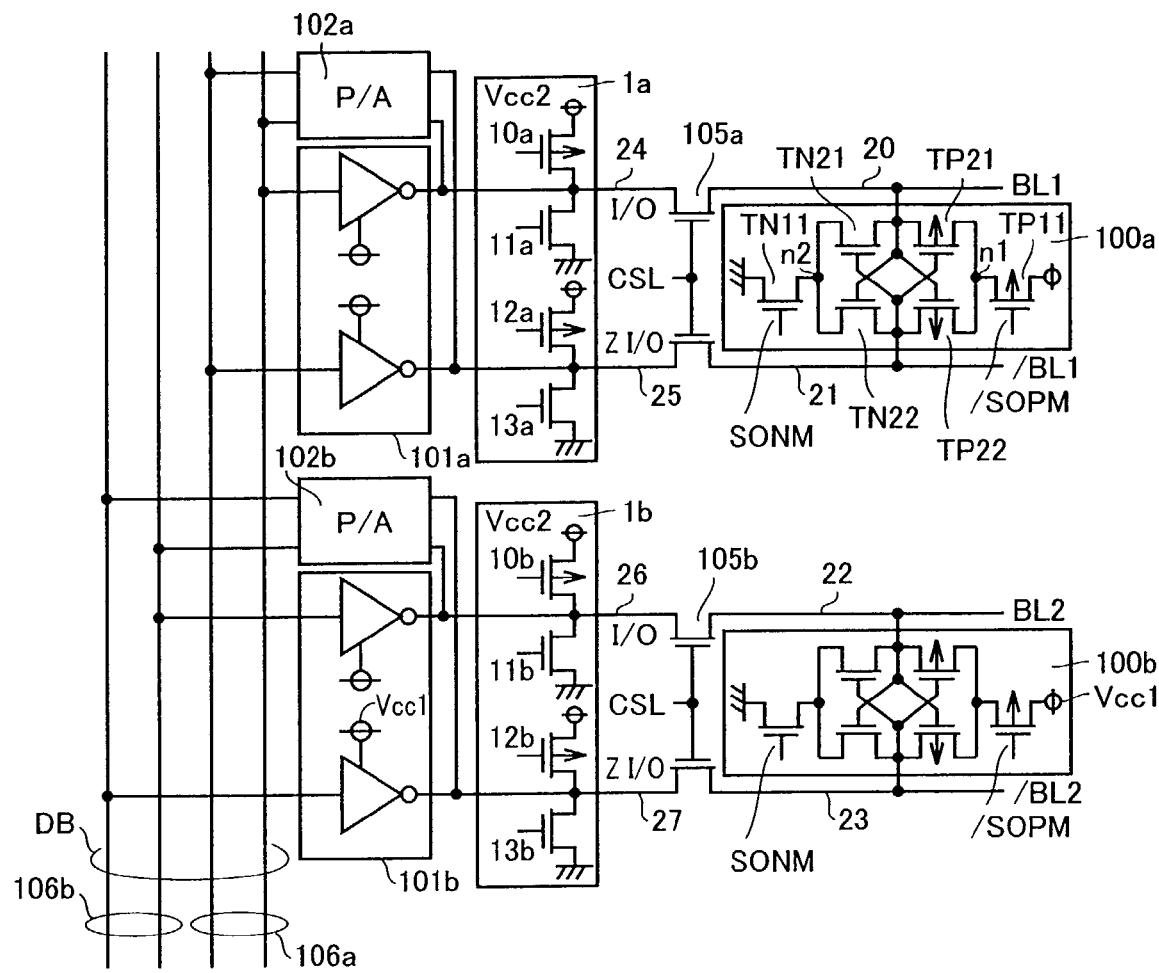
FIG. 3 is a block diagram extracting and schematically showing a configuration of a sense amplifier circuit 100, a burn in write buffer 1, a write buffer 101 and a preamplifier 102.

FIG. 3 extracts a portion of the FIG. 2 circuit, schematically showing a configuration of sense amplifier circuit 100, burn in write buffer 1, write buffer 101 and preamplifier 102.

As will be apparent from the following description, in the present embodiment sense amplifier 100 connecting to bit line pair BLP is operable to apply stress voltage for example to a bit line pair, whatever data a memory cell may hold or whether or not the memory cell is selected. Hereinafter, a burn in test conducted with stress voltage applied whatever data a memory cell may hold, will be referred to as a "static burn in test."

In the FIG. 3 configuration when column select signals CSL is activated bit lines BL1, /BL1 is responsively connected to I/O line pair 24, 25 and simultaneously in response to the same column select signal CSL attaining an active state bit lines BL2, /BL2 are connected to I/O line pair 26, 27.

Furthermore write buffer 1 includes a buffer circuit 1a provided to correspond to bit lines BL1, /BL1 and I/O lines 24, 25, and a buffer circuit 1b provided to correspond to bit lines BL2, /BL2 and I/O lines 26, 27.

Buffer circuit 1a includes a p channel MOS transistor 10a provided between I/O line 24 corresponding to bit line BL1 and power supply voltage Vcc2 and having the gate controlled in potential by control circuit 32, an n channel MOS transistor 11a provided between I/O line 24 and ground potential Vss and having the gate controlled in potential by control circuit 32, a p channel MOS transistor 12a provided between power supply voltage Vcc2 and I/O line 25 corresponding to bit line /BL1 and having the gate controlled in potential by control circuit 32, and an n channel MOS transistor 13a provided between I/O line 25 and ground potential Vss and having the gate controlled in potential by control circuit 32.

Buffer circuit 1b also includes p and n channel MOS transistors 10b and 11b corresponding to I/O line 26 corresponding to bit line BL2, and p and n channel MOS transistors 12b and 13b corresponding to I/O line 27 corresponding to bit line /BL2.

Bit lines BL1 and /BL1 connect to I/O lines 24 and 25, respectively, via an I/O gate 105a conducting in response to column select signal CSL. For bit lines BL1 and /BL1, sense amplifier circuit 100a activated by control circuit 32 is provided.

Sense amplifier circuit 100a includes a p channel MOS transistor TP11 provided between power supply voltage Vcc1 and an internal node n1 and having the gate controlled in potential by a signal /SOPM output from control circuit 32, an n channel MOS transistor TN11 provided between ground potential Vss and an node N2 and having the gate controlled in potential by control circuit 32, p and n channel MOS transistors TP21 and TN21 connected in series between nodes N1 and N2, and p and n channel MOS transistors TP22 and TN22 connected in series between nodes n1 and n2.

Transistors TP21 and TN21 have their respective gates both coupled with a node connecting transistors TP22 and TN22, and also coupled with bit line /BL1. Transistors TP22 and TN22 have their respective gates both coupled with a node connecting transistors TP21 and TN21, and also coupled with bit line BL1.

Also corresponding to bit lines BL2 and /BL2, a similar sense amplifier circuit 100b is provided.

Data read from memory cell MC coupled with bit lines BL1, /BL1 is amplified by sense amplifier circuit 100a and transmitted through I/O gate 105a to I/O lines 24, 25 and further to a data bus 106a by preamplifier circuit 102a.

Similarly, data read from memory cell MC coupled with bit lines BL2, /BL2 is transmitted to a data bus 106b through I/O gate 105b, I/O lines 26, 27 and preamplifier circuit 102b.

By contrast, in the normal mode of operation for the write operation data bus 106a transmits data to be written which is in turn transmitted by write buffer 101a to I/O lines 24 and 25, and by I/O gate 105a turning on, the data is transmitted to bit lines BL1 and /BL1.

Similarly, data bus 106b transmits data to be written which is in turn transmitted to bit line pair BL2, /BL2 through write buffer 101b, I/O lines 26, 27 and gate transistor 105b.

In the static burn in test, buffer circuit 1a or 1b drives a level in potential of I/O line pair 24, 25 or 26, 27 and this driven potential is transmitted to bit line pair BL1, /BL1 or BL2, /BL2.

Herein, as has been described previously, power supply potential Vcc2 supplied to p channel MOS transistors 10a, 12a, 10b and 12b is assumed to be higher voltage than power supply voltage Vcc1 for a sense amplifier and capable of driving a bit line's level in potential high greater than the sense amplifier. As such, for example a potential between power supply potentials Vcc1 and Vcc2 or a potential Vcc3 exceeding power supply potential Vcc2 may be provided for a drive power supply for buffer circuits 1a, 1b.

Furthermore, since power supply voltage Vcc2 is higher in level than power supply voltage Vcc1, transistors 10a, 10b, 12a and 12b can have a size smaller for example than transistor TP11 in a sense amplifier.

In buffer circuit 1a transistors 10a and 11a do not turn on simultaneously and they have complementary ON and OFF states. Transistors 12a and 13a also operate complementary to each other.

Also in buffer circuit 1b transistors 10b and 11b operate complementary to each other and so do transistors 12b and 13b.

It should be noted, however, that as will be described hereinafter, transistors 10a and 10b can simultaneously turn on, as controlled by control circuit 32.

Figure 4:
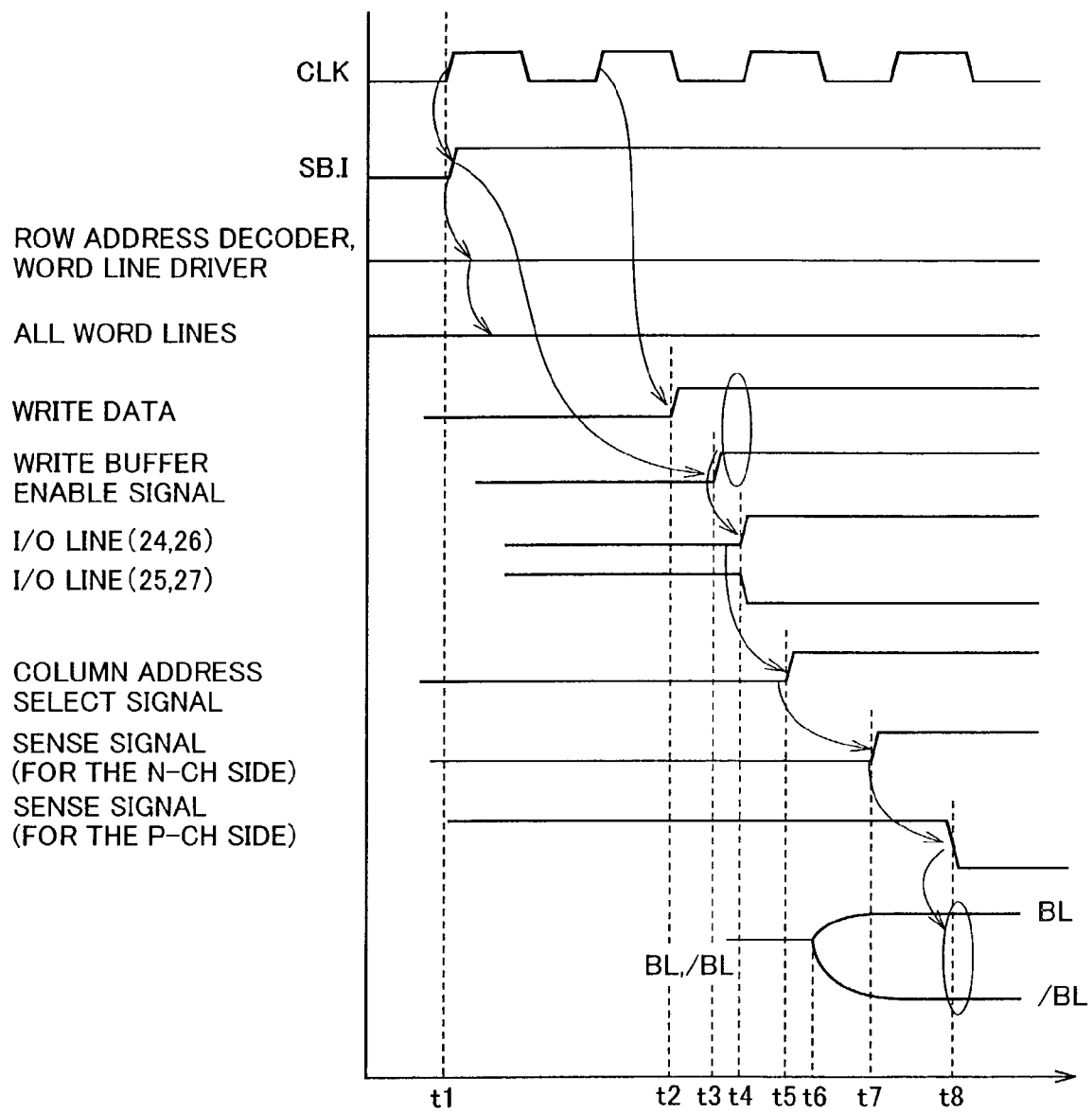
FIG. 4 is timing plots representing an operation in a static burn in test.

FIG. 4 is timing plots for illustrating an operation provided in conducting the static burn in test on DRAM 1000 as described with reference to FIGS. 1–3.

With reference to FIG. 4, at time t1 clock signal CLK transitions high and a combination of externally applied control signals designates an entry of the static burn in test mode of operation and control circuit 32 outputs an internal recognition signal SPI attaining a high level of an active state.

Thus the static burn in test operation is entered and in response to signal SBI having the active state control circuit 32 controls row address decoder 3 and word line driver 103 to be held in a standby state. Thus word lines WLs are all held low.

After time t1 clock signal CLK is again activated and in response thereto at time t2 control circuit 32 outputs signals WD1 to WD4 provided to set a level in potential of I/O lines 24–27. Furthermore, in response to signal SBI activated at time t1, control circuit 32 at time t3 outputs a burn in write buffer enable signal, a signal provided to control a gate in potential of transistors 10a to 13b in buffer circuits 1a and 1b.

In response, I/O lines 24, 26 and I/O lines 25, 27 have their levels in potential set to be a level in accordance with data WD1 to WD4.

Subsequently, control circuit 32 controls column address decoder 2 and at time t5 selectively activates column select signal CSL to turn on I/O gate 105.

Herein in the normal mode of operation it activates a column select signal selecting a single one of memory cell columns connected to a single I/O line. By contrast, in the static burn in test it can activate a plurality or all of column select signals corresponding to a plurality of memory cell columns capable of coupling with a single I/O line pair.

As will be apparent from the following description, in the first embodiment it can activate simultaneously all of column select signals corresponding to a plurality of memory cell columns connectable to a single I/O line.

Again with reference to FIG. 4 at time t6 bit lines BL, /BL have a level in potential driven in accordance with that of an I/O line pair.

At time t7, as controlled by control circuit 32 a sense amplifier enable signal SONM is activated and bit lines 20–23 receive stress voltage. Of the sense amplifier enable signal, a signal SONM corresponding to n channel MOS transistor TN11 on the ground potential side initially conducts and subsequently when a predetermined period of time elapses a signal /SOPM is activated and p channel MOS transistor TP11 on the power supply potential Vcc1 side turns on. Thus on the p channel transistor side and the n channel transistor side a timing for activation can be offset to reduce through-current.

Figure 5:
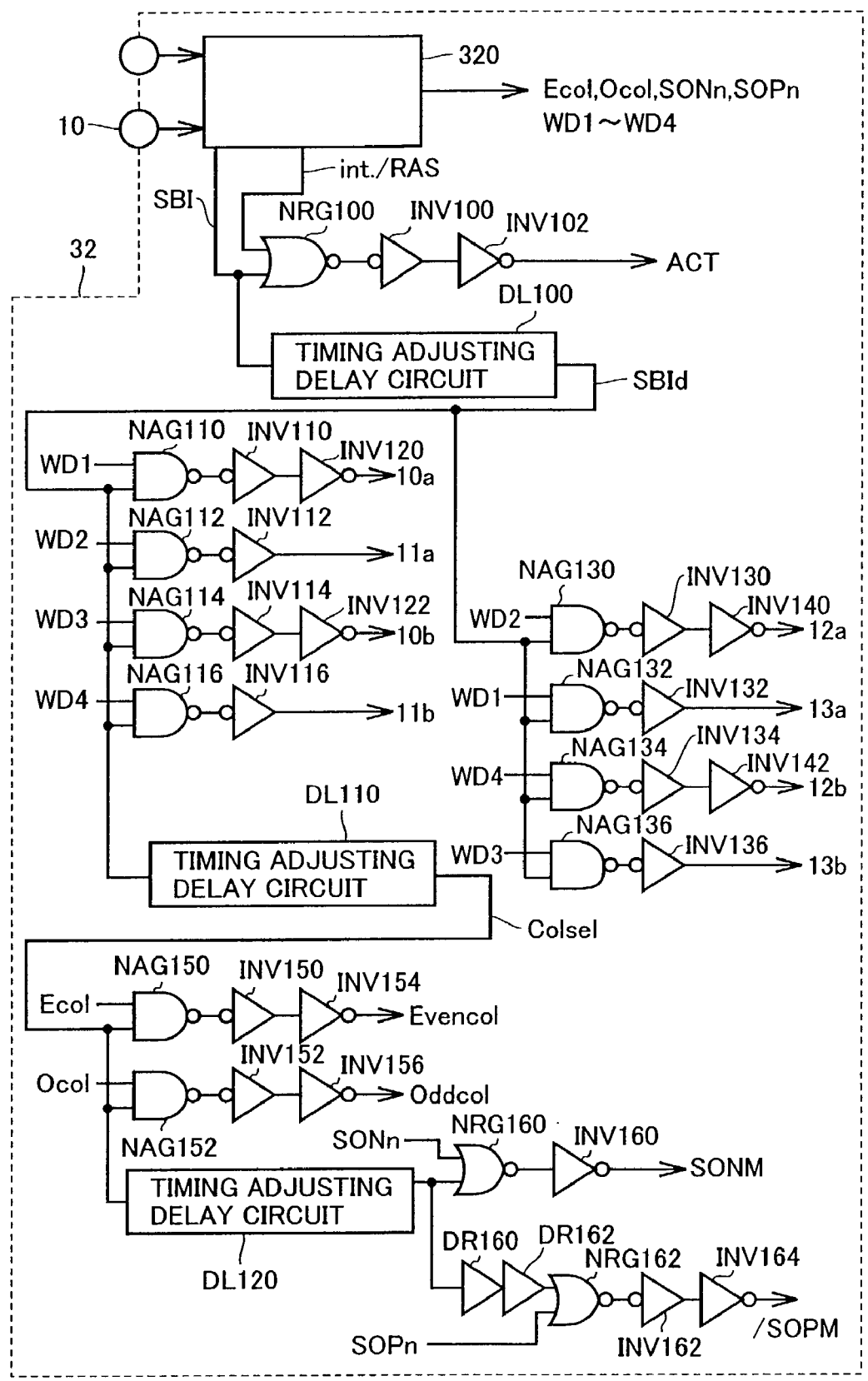
FIG. 5 is a circuit diagram for illustrating a configuration of a burn in test control circuit provided to control a burn in test operation.

FIG. 5 is a circuit diagram for illustrating a configuration of a burn in test control circuit included in the FIG. 1 control circuit 32 to control the burn in test operation.

As shown in FIG. 5, the burn in test control circuit includes a control signal generation circuit 320 generating an internal row address strobe signal int/RAS and the like to correspond to external row address strobe signal /RAS and the like and also operative in response to a combination of external control signals to generate internal recognition signal SBI indicating that the static burn in test has been entered, an NOR circuit NRG100 receiving internal row address strobe signal int/RAS and internal recognition signal SBI, an inverter INV100 receiving and inverting an output of NOR circuit NRG100, an inverter INV102 receiving an output of inverter INV100 to output an internal control signal ACT provided to indicate that a row-related operation be activated, and a timing adjusting delay circuit DL100 receiving signal SBI and delaying it for a predetermined period of time to generate a signal SBId.

More specifically, when internal recognition signal SBI, indicative of a result of recognition that the burn in test mode has been entered, has an active state (a high level), signal ACT has an inactive state (a low level) and a low-related, select operation is held inactive.

Delay circuit DL100 controls a delay time producing a temporal margin to output an internal control signal provided to control the burn in test operation after an internal circuit stabilizes.

As will be described hereinafter, write data WD1 to WD4 have a level determined by a combination of an externally applied control signal and an address signal or information previously held in control signal generation circuit 320.

The burn in test control circuit further includes an NAND circuit NAG110 receiving write data WD1 and signal SBId, an inverter INV110 receiving and inverting an output of NAND circuit NAG110, an inverter INV120 receiving an output of inverter INV110 and outputting a signal controlling the gate of transistor 10a in potential, an NAND circuit 112 receiving write data WD2 and signal SBId, an inverter INV112 receiving and inverting an output of NAND circuit NAG112 and outputting a signal applied to control the gate of transistor 11a in potential, an NAND circuit NAG 114 receiving write data WD3 and signal SBId, an inverter INV114 receiving and inverting an output of NAND circuit NAG114, an inverter INV122 receiving an output of inverter INV114 and outputting a signal controlling the gate of transistor 10b in potential, an NAND circuit NAG116 receiving write data WD4 and signal SBId, and an inverter INV116 receiving and inverting an output of NAND circuit NAG116 and outputting a signal controlling the gate of transistor 11b in potential.

The burn in test control circuit further includes an NAND circuit NAG130 receiving write data WD2 and signal SBId, an inverter INV130 receiving and inverting an output of NAND circuit NAG 130, an inverter INV140 receiving an output of inverter INV130 and outputting a signal controlling the gate of transistor 12a in potential, an NAND circuit 132 receiving write data WD1 and signal SBId, an inverter INV132 receiving and inverting an output of NAND circuit NAG132 an outputting a signal controlling the gate of transistor 13a in potential, an NAND circuit NAG134 receiving write data WD4 and signal SBId, an inverter INV134 receiving and inverting an output of NAND circuit NAG134, an inverter INV142 receiving an output of inverter INV134 and outputting a signal controlling the gate of transistor 12b in potential, an NAND circuit NAG136 receiving write data WD3 and signal SBId, and an inverter INV136 receiving and inverting an output of NAND circuit NAG136 and outputting a signal controlling the gate of transistor 13b in potential.

The burn in test control circuit further includes a timing adjusting delay circuit DL110 receiving signal SBId and delaying the signal for a predetermined period of time to output a signal Colsel. Delay circuit DL110 adjusts a period of time elapsing while write data WD1 to WD4 are generated and an I/O line is set to have power supply potential Vcc2 or ground potential Vss and furthermore before the potential level stabilizes.

The burn in test control circuit further includes an NAND circuit NAG 150 receiving signal Colsel from delay circuit DL110 and a signal Ecol activated or inactivated in response to a combination of an externally applied control signal and an address signal or information previously held in control signal generation circuit 320, an inverter INV150 receiving and inverting and output of NAND circuit NAG150, an inverter INV154 receiving an output of inverter INV150 and outputting a signal Evencol for controlling a column decoder, as will be described hereinafter, an NAND circuit NAG152 receiving signal Colsel and a signal Ocol activated or inactivated in response to a combination of an external control signal and an address signal or information previously held in control signal generation circuit 320, an inverter INV152 receiving and inverting an output of NAND circuit NAG152, an inverter INV156 receiving an output of inverter INV152 and outputting a signal Oddcol provided to control column decoder 2, a timing adjusting delay circuit DL120 receiving signal Colsel and delaying the signal for a predetermined period of time for output, an NOR circuit NRG160 receiving an output of delay circuit DL120 and a signal SONn generated in control signal generation circuit 320 and indicating that a sense amplifier be enabled, an inverter INV160 receiving an output of NOR circuit NRG160 and outputting a signal SONM provided to activate transistor TN11 in a sense amplifier, drive circuits DR160 and DR162 receiving an output of delay circuit DL120, an NOR circuit NRG162 receiving an output of drive circuit DR162 and a signal SOPn generated in control signal generation circuit 320 to indicate that a sense amplifier be enabled, an inverter INV162 receiving and inverting an output of NOR circuit NRG162, and an inverter INV164 receiving and inverting an output of inverter INV162 to output a signal /SOPM provided to drive transistor TP11 in a sense amplifier.

More specifically, control circuit 32 outputs signals Evencol and Oddcol and in response thereto a column select signal is activated and an I/O line's potential is transmitted to sense amplifier 100 of a bit line pair selected. Sense amplifier 100 has an input/output node driven and thus attaining a power supply potential or a ground potential and subsequently when a predetermined period of time elapses signals SONM and /SOPM attain an active state to enable a sense amplifier.

Figure 6:
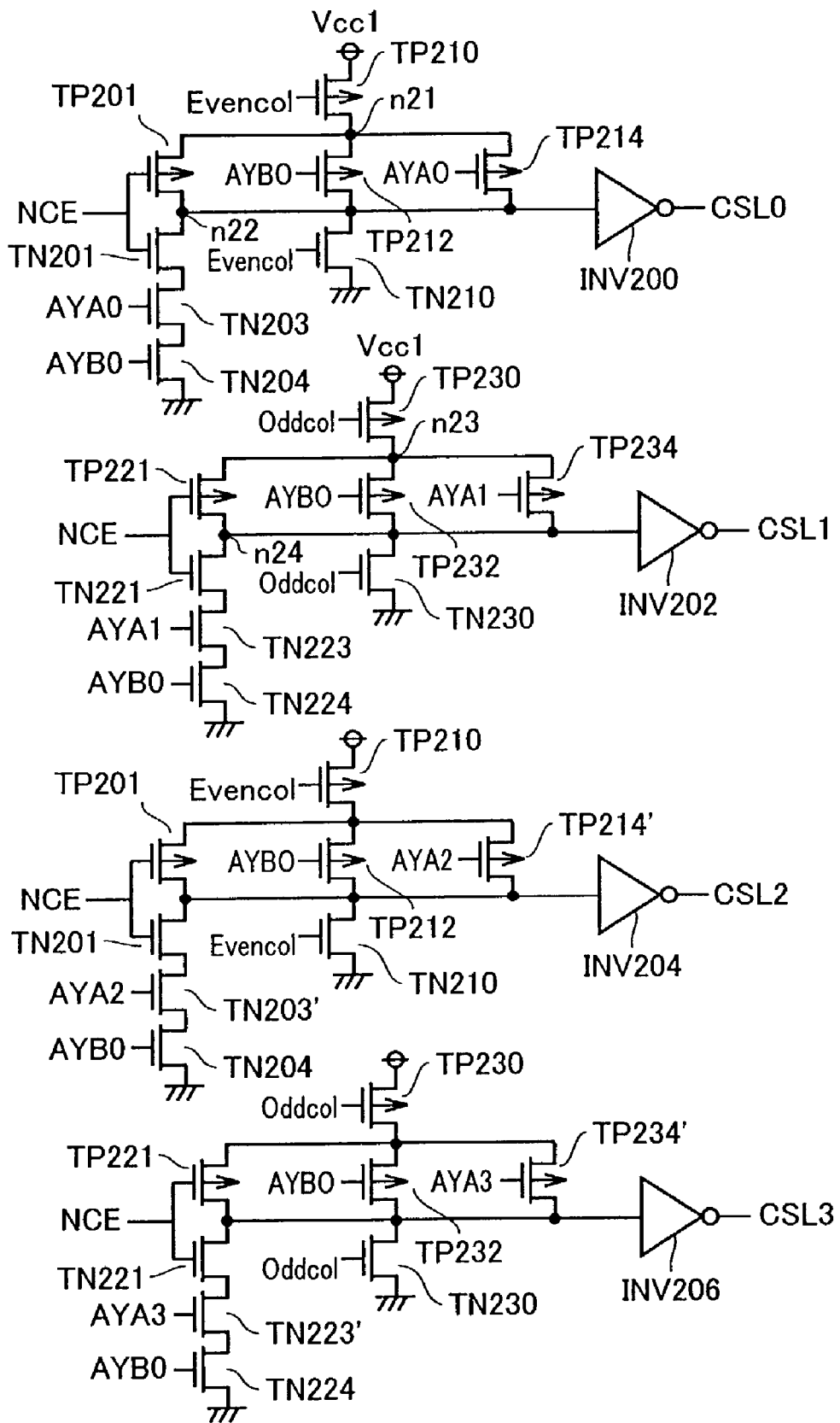
FIG. 6 is a circuit diagram for illustrating a configuration of a column address decoder 2.

FIG. 6 is a circuit diagram for illustrating a configuration of column address decoder 2. To simplify the description, FIG. 6 representatively shows a portion related to column select signals CSL0 to CSL3 of a plurality of column select signals CSLs generated by column address decoder 2.

As such, column address decoder 2 receives a signal NCE output from control circuit 32 to indicate that column address decoder 2 be enabled, and internal column address signals AYA0 to AYA3 and AYB0 corresponding to any of column-related, internal column address signals CA[0] to CA[k], /CA[0] to CA[k], respectively.

With reference to FIG. 6, column address decoder 2 in the normal mode of operation receives from control circuit 32 signals Evencol and Oddcol both having a low level.

Thus an node n21 in the normal mode of operation receives power supply potential Vcc1.

Between node N21 and ground potential Vss there are provided a p channel MOS transistor TP201 having a gate receiving signal NCE, an n channel MOS transistor TN201 having a gate receiving signal NCE, and n channel MOS transistors TN203 and TN204 having their gates receiving address signals AYA0 and AYB0.

Between a node N22 connecting transistors TP201 and TN201 and ground potential Vss is provided an n channel MOS transistor TN210 having a gate receiving signal Evencol, and between node n21 and power supply potential Vcc1 is provided a p channel MOS transistor TP210 having a gate receiving signal Evencol. Between nodes n21 and n22 are provided p channel MOS transistors TP212 and TP214 arranged in parallel and having their respective gates receiving address signals AYB0 and AYA0, respectively.

Inverter INV200 receives and inverts a level of node N22 to generate a column select signal CSL0.

Furthermore node n23 in the normal mode operation also receives power supply potential Vcc1 as signal Oddcol has the low level.

Between node n23 and ground potential Vss there are provided a p channel MOS transistor TP221 having a gate receiving signal NCE, an n channel MOS transistor TN221 having a gate receiving signal NCE, and n channel MOS transistors TN223 and TN224 having their gates receiving address signals AYA1 and AYB0.

Between a node N24 connecting transistors TP221 and TN221 and ground potential Vss is provided an n channel MOS transistor TN230 having a gate receiving signal Oddcol, and between node N23 and power supply potential Vcc1 is provided a p channel MOS transistor TP230 having a gate receiving signal Oddcol. Between nodes n23 and n24 are provided p channel MOS transistors TP232 and TP234 arranged in parallel and having their respective gates receiving address signals AYB0 and AYA1, respectively.

Inverter INV202 receives and inverts a level of node n24 to generate a column select signal CSL1.

Furthermore, to generate a column select signal CSL2 a similarly configured circuit is provided except a circuit operating to generate column select signal CSL0 and an internal address signal received, and to generate a column select signal CSL3 a similarly configured circuit is provided except a circuit provided to generate column select signal CLS1 and an internal address signal received.

Figure 7:
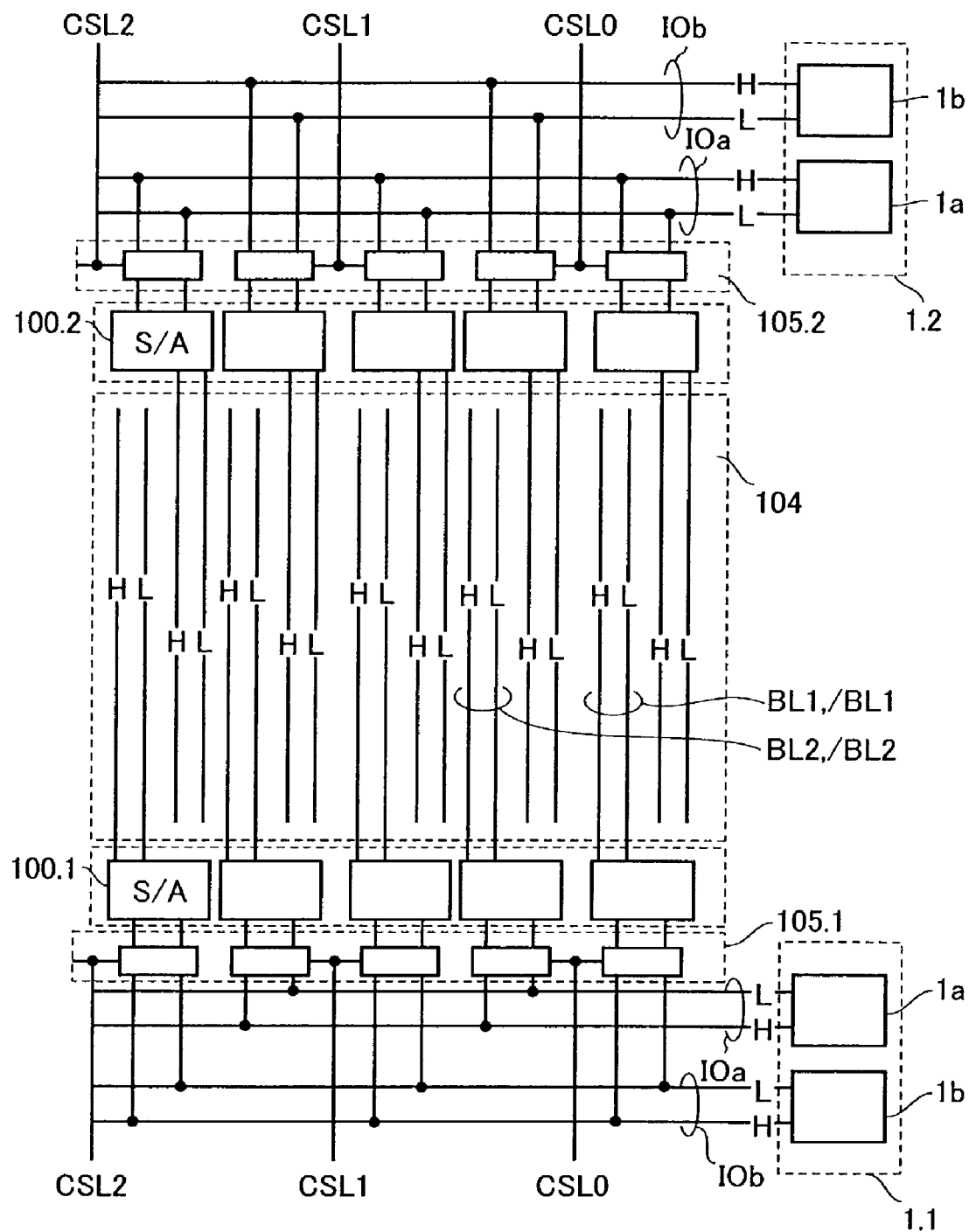
FIG. 7 is a block diagram schematically representing for the FIG. 6 configuration of column address decoder 2 an arrangement of stress voltage applied in to a corresponding bit line pair.

For the FIG. 6 column decoder 2 in the burn in test operation when signals Evencol and Oddcol both attain an active state (a high level) a corresponding line pair receives stress voltage in an arrangement, as schematically shown in FIG. 7.

As shown in FIG. 7, memory cell array 104 is sandwiched by opposite sense amplifiers 100.1 and 100.2 for the sake of illustration. Furthermore in response to column select signal CSL0 two bit line pairs BL1, /BL1 and BL2, /BL2 are simultaneously selected for the sake of illustration. Similarly, when other column select signals CSL1 to CSL3 are activated two bit line pairs are responsively, simultaneously selected for the sake of illustration.

When signals Evencol and Oddcol both have an active state, nodes n22 and n24 constantly have a low level whatever level an address signal may have, and column select signals CSL0 to CSL3 thus all have an active state (a high level).

Furthermore, burn in write buffers 1.1 and 1.2 are also arranged on opposite sides of memory cell array 104. Buffer circuit 1a in burn in write buffer 1.1 and buffer circuit 1a in burn in write buffer 1.2 provide a corresponding I/O line with complimentary potential, and buffer circuit 1b in burn in write buffer 1.1 and buffer circuit 1b in burn in write buffer 1.2 also provide a corresponding I/O line with complementary potential.

In response, memory cell array 104 has a bit line pair receiving a stress potential allowing adjacent bit lines to be constantly opposite in potential.

A bit line pair corresponding to a memory cell column in regular memory cell array RMR and a bit line pair corresponding to a redundant memory cell column also receive stress voltage generated by burn in write buffer 1. Thus, whether a bit line pair exists in a regular memory cell array or a redundant memory cell column, it receives a stress potential allowing adjacent bit lines to be constantly opposite in potential.

Thus, whatever data may be held in a memory cell that is held in a non-selected state, a bit line pair or the like can receive stress voltage.

Second Embodiment

In the first embodiment all adjacent bit lines receive a stress voltage allowing them to be opposite in potential.

In the second embodiment a particular bit line receives a stress voltage to allow acceleration between bit lines with a bit line posed therebetween.

Figure 8:
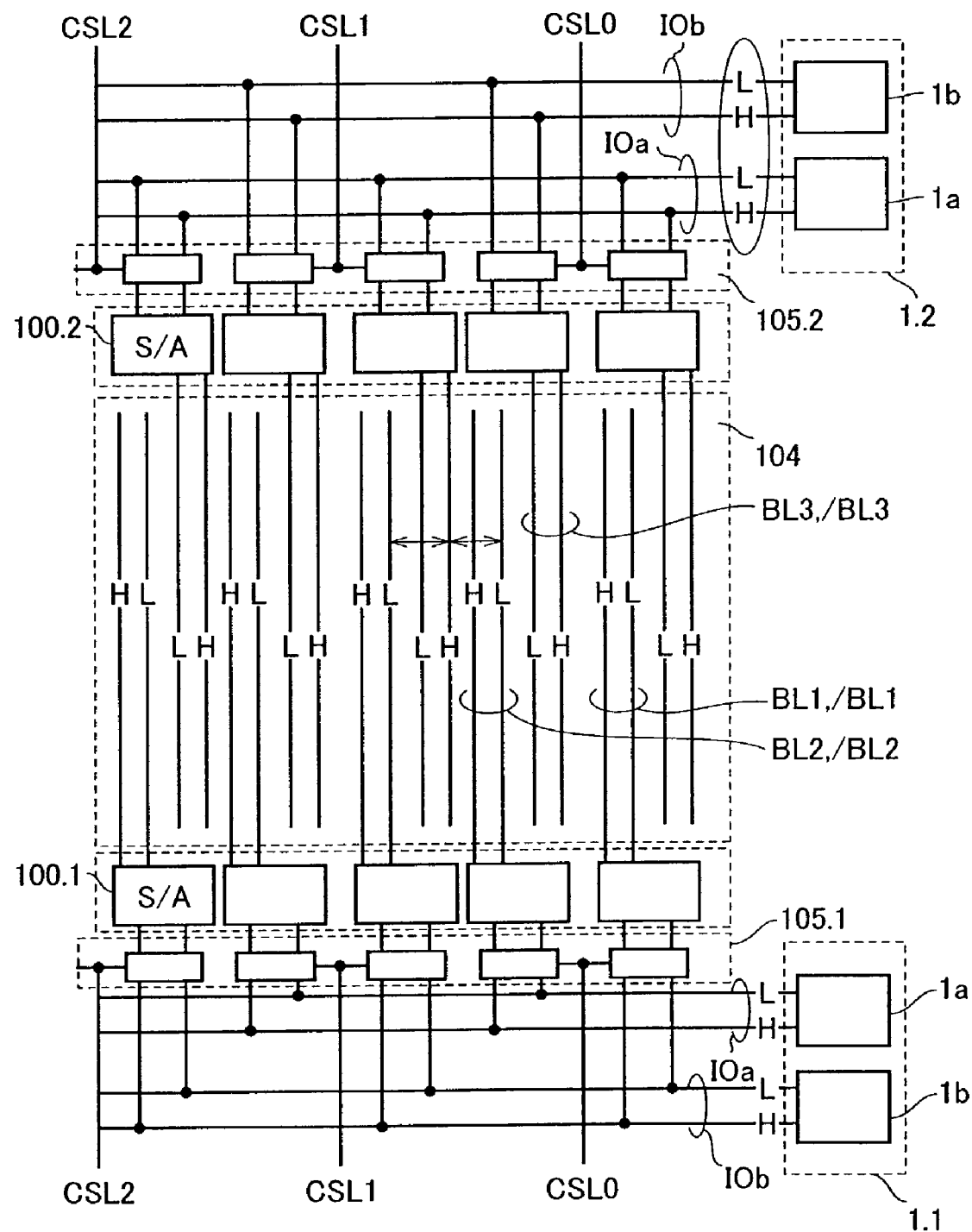
FIG. 8 represents a concept of another example of stress voltage application.

FIG. 8 represents a concept showing another example of applying a stress voltage.

In FIG. 8, a complementary level with which buffer circuit 1a in burn in write buffer 1.1 drives an I/O line pair IOa and that with which buffer circuit 1a in burn in write buffer 1.2 drives I/O line pair IOa are inverted symmetrically. Similarly, a complementary level with which buffer circuit 1b in burn in write buffer 1.1 drives an I/O line pair IOb and that with which buffer circuit 1b in burn in write buffer 1.2 drives I/O line pair IOb are inverted symmetrically.

Thus control circuit 32 for the FIG. 5 configuration has a configuration for controlling an output level of burn in write buffer 1.1 and that for controlling an output level of burn in write buffer 1.2, separately, and thus controls the output level of burn in write buffer 1.1 and that of burn in write buffer 1.2 independently.

Thus, bit line pair BL1, /BL1 receives opposite potential, whereas between bit line pair BL1, /BL1 and bit line pair BL3, /BL3 adjacent thereto any stress voltage is not applied.

Third Embodiment

Figure 9:
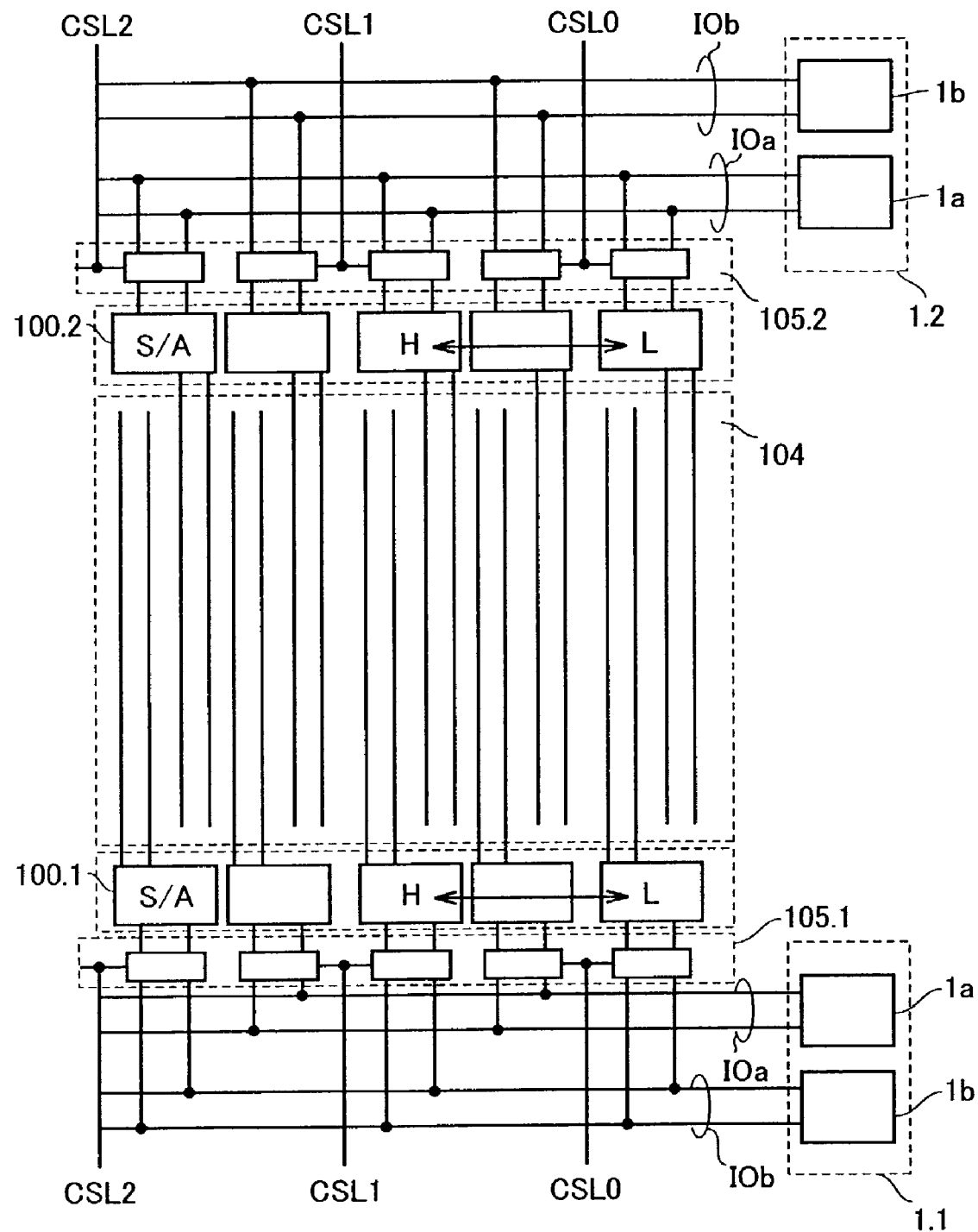
FIG. 9 represents a concept of a configuration provided to apply stress voltage between a bit line in a sense amplifier and a bit line in another sense amplifier.

FIG. 9 represents a concept showing a configuration for applying stress voltage between a bit line in a sense amplifier and a bit line in another sense amplifier.

Stress voltage is applied, as follows: in the FIG. 6 column address decoder 2 when signal Evencol has a high level, signal Oddcol is adapted to have a low level.

Alternatively, when signal Oddcol has a high level, signal Evencol is controlled to have a low level.

For example in burn in write buffer 1.1 buffer circuit 1b drives both of the IO lines of I/O line pair IOb high and signal Oddcol is set high and signal Evencol is set low. Column select signal CSL1 attains an active state and a corresponding sense amplifier receives a potential of I/O line pair IOb, whereas column selects signal CLS0 attains an inactive state and a corresponding sense amplifier does not receive a potential of I/O line pair IOa.

Thus, stress potential can be applied between a bit line in a sense amplifier and a bit line in another sense amplifier.

When such an operation is employed to divide and thus operate column address decoder 2, stress can also be applied between column select lines. More specifically, for the example described above, stress is also applied between interconnections transmitting column select signals CSL0 and CSL1, respectively.

Fourth Embodiment

In a fourth embodiment of the present invention control circuit 32 in the burn in test mode reduces a level in voltage of a gate of transistors 10a, 10b, 12a and 12b of buffer circuits 1a and 1b of burn in write buffer 1 of FIG. 3 to a vicinity of a threshold voltage and operates a sense amplifier to control an operation of DRAM 1000 to provide a electric current leak pass for I/O gate 105.

More specifically in FIG. 3 for example control circuit 32 allows transistors 11a and 13b to continue to have a disconnected state while transistors 10a and 12a to have a gate potential level reduced to a threshold voltage. Furthermore, control circuit 32 allows column select signal CSL to be activated and sense amplifier enable signal SONM to also have an active state.

Thus in sense amplifier 100a transistors TN21 and TN11 conduct and in I/O gate 105a a transistor is provided with a leak current path constantly extending from power supply potential Vcc2 to reach ground potential Vss.

Figure 10:
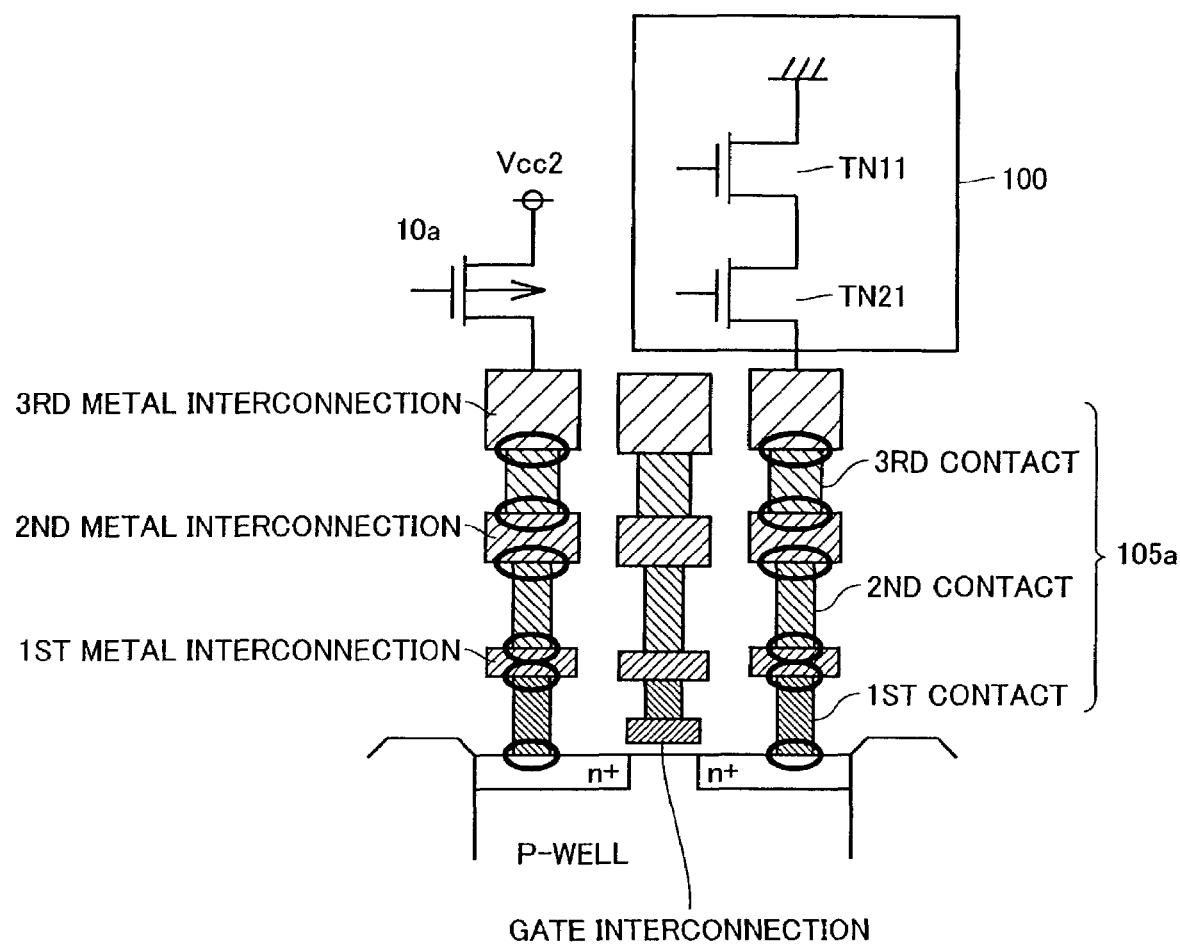
FIG. 10 represents a concept schematically showing a configuration of a transistor in an I/O gate 105a, as seen in cross section.

FIG. 10 represents a concept schematically showing a configuration of a transistor in I/O gate 105a, as seen in cross section.

As shown in FIG. 10, when in I/O gate 105a a transistor is provided with an electric current path constantly extending from power supply potential Vcc2 to reach ground potential Vss, stress voltage is applied to each bonded portion of each contact of a multilevel interconnection for the transistor in I/O gate 105a.

More specifically, the transistor has a source and a drain with a first metal interconnection connected thereto via a first contact hole, and the first metal interconnection couples with a second metal interconnection via a second contact. Furthermore, the second metal interconnection couples with a third metal connection via a third contact.

Stress voltage is applied to a contact bonding portion between a buried electrode in the first contact hole and a source/drain electrode, that between a buried electrode in the first contact and the first metal interconnection, that between a buried electrode of the second contact and the first metal interconnection, that between a buried electrode of the second contact and the second metal interconnection, that between a buried electrode of the third contact and the second metal interconnection, and that between the third metal interconnection and a buried electrode of the third contact.

Thus, in the burn in test, stress can be applied to a transistor configuring an I/O gate opening and closing a coupling of a bit line pair and an I/O line pair.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
    a control circuit controlling a normal operation and a test operation of said semiconductor memory device;

a memory cell array having a plurality of memory cells arranged in rows and columns;

a plurality of bit line pairs provided to correspond to said columns of said memory cell array;

a plurality of data line pairs each provided to correspond to a predetermined number of said plurality of bit line pairs;

a write circuit operative in said normal operation in response to data provided external to said semiconductor memory device to be written, to drive a level in potential of said data line pair;

a test potential drive circuit controlled in said test operation by said control circuit to drive a level in potential of said data line pair instead of said write circuit; and a column select circuit operative in said normal operation in response to an address signal and controlled in said test operation by said control circuit to select said column of said memory cells and transmitting said level in potential of said data line pair to said bit line pair corresponding to said selected column of said memory cells.

2. The device of claim 1, wherein said column select circuit in said test operation selects simultaneously a plurality of said bit line pairs capable of coupling with a single one of said data line pairs.

3. The device of claim 1, comprising:

a plurality of word lines provided to correspond to said rows of said memory cell array; and a row select circuit operative in said normal operation in response to said address signal and controlled in said test operation by said control circuit to selectively activate said word line, wherein said control circuit in said test operation continues to hold said plurality of word lines in an inactive state.

4. The device of claim 1, wherein said memory cell array includes;

a regular memory cell array having a plurality of regular memory cells; and a redundant memory cell column having a plurality of redundant memory cells selectable in place of said regular memory cell if said regular memory cell array has a defective memory cell, wherein said column select circuit in said test operation selects simultaneously a plurality of said regular memory cell columns and said redundant memory cell column capable of coupling with a single one of said data line pairs.

5. The device of claim 1, wherein:

said memory cell array is divided into a first memory cell column group including a plurality of first memory cell columns and a second memory cell column group including a plurality of second memory cell columns each sandwiched between said first memory cell columns;

said plurality of data line pairs includes a first data line pair provided common to a plurality of said first memory cell columns and a second data line pair provided common to a plurality of said second memory cell columns; and said test potential driver circuit includes a first drive circuit operative in said test operation in response to said control circuit to drive a level of said first data line pair and a second drive circuit operative in said test operation in response to said control circuit to drive a level of said second data line pair.

6. The device of claim 5, wherein said control circuit controls said level in potential driven by said first drive circuit and that in potential driven by said second drive circuit independently.

7. The device of claim 1, further comprising a plurality of sense amplifiers provided to correspond to said bit line pair to amplify a difference in potential on said bit line pair, wherein:

said column select circuit includes a decode circuit operative in said normal operation in response to an address signal and controlled in said test operation by said control circuit to selectively activate a plurality of column select signals, and a plurality of transmission circuits provided to correspond to said bit line pair and selectively activated by a corresponding one of said plurality of column select signals to transmit said level in potential of said data line pair to said bit line pair corresponding to said selected column of said memory cells; and said control circuit in said test operation activates alternately said plurality of transmission circuits corresponding to an adjacent one of said bit lines.

8. The device of claim 1, further comprising a plurality of sense amplifiers provided to correspond to said bit line pair and controlled by said control circuit to receive at least a first power supply potential selectively to amplify a difference in potential on said bit line pair, wherein:

said column select circuit includes a decode circuit operative in said normal operation in response to an address signal and controlled in said test operation by said control circuit to selectively activate a plurality of column select signals, and a plurality of transmission circuits provided to correspond to said bit line pair and selectively activated by a corresponding one of said plurality of column select signals to transmit said level in potential of said data line pair to said bit line pair corresponding to said selected column of said memory cells; and said control circuit said test operation controls said test potential drive circuit to couple a data line of said data line pair with a second power supply potential higher than said first power supply potential, activates said transmission circuit and supplies said sense amplifier with said first power supply potential.

* * * * *